(12) United States Patent
Matsuzawa et al.

(10) Patent No.: US 7,969,072 B2
(45) Date of Patent: Jun. 28, 2011

(54) ELECTRONIC DEVICE AND MANUFACTURING METHOD THEREOF

(75) Inventors: Juichiro Matsuzawa, Minowa-machi (JP); Kazuhiko Shimodaira, Minowa-machi (JP)

(73) Assignee: Epson Toyocom Corporation, Tokyo (JP)

( * ) Notice: Subject to any disclaimer, the term of this patent is extended or adjusted under 35 U.S.C. 154(b) by 0 days.

(21) Appl. No.: 12/568,012

(22) Filed: Sep. 28, 2009

(65) Prior Publication Data
US 2010/0079035 A1 Apr. 1, 2010

(30) Foreign Application Priority Data

Sep. 30, 2008 (JP) ................................ 2008-254104

(51) Int. Cl.
*H01L 41/053* (2006.01)
(52) U.S. Cl. ...................... 310/348; 310/340; 310/344
(58) Field of Classification Search .................. 310/340, 310/344, 348
See application file for complete search history.

(56) References Cited

U.S. PATENT DOCUMENTS

| | | | | |
|---|---|---|---|---|
| 6,087,759 A | * | 7/2000 | Pfeil | 310/321 |
| 6,703,768 B2 | * | 3/2004 | Kageyama et al. | 310/344 |
| 2008/0067892 A1 | * | 3/2008 | Chiba et al. | 310/314 |

FOREIGN PATENT DOCUMENTS

| | | |
|---|---|---|
| JP | A-2008-78778 | 4/2008 |
| JP | A-2008-136169 | 6/2008 |
| JP | 2008-300913 | * 12/2008 |
| JP | A-2009-60333 | 3/2009 |
| JP | A-2009-60334 | 3/2009 |

* cited by examiner

*Primary Examiner* — Thomas M Dougherty
(74) *Attorney, Agent, or Firm* — Oliff & Berridge, PLC

(57) ABSTRACT

An electronic device includes: a package including a lid and a package base, the package being formed by bonding the lid to a joint surface of the package base using a bonding material; and a resin portion covering the package. The resin portion covers at least the package base and the bonding material, and at least a part of the resin portion has a section outline. The section outline has an outermost portion thereof in a direction parallel with a mount surface of the electronic device. The outermost portion is located below a lower surface of the lid in a direction perpendicular to the mount surface of the electronic device.

5 Claims, 9 Drawing Sheets

ELECTRONIC DEVICE AND MANUFACTURING METHOD THEREOF

BACKGROUND

1. Technical Field

The present invention relates to an electronic device and a manufacturing method thereof. In particular, the invention relates to an electronic device where a resin is molded around a package and that is favorably used when using a glass lid as a lid of the package, and a manufacturing method thereof.

2. Related Art

As an example of an electronic device that meets both downsizing of the mount area and ensuring of good airtightness, a piezoelectric device as shown in FIG. 19 is known. Specifically, a piezoelectric device 1 shown in FIG. 19 is a so-called "two-story-structure" piezoelectric device where a circuit element, such as an IC 3, is mounted on a wiring substrate 2 and a conductive coupling member 5 is interposed between a piezoelectric resonator 4 disposed above the wiring substrate 2 and the wiring substrate 2. In the piezoelectric device 1, the surfaces of the elements, including the upper surface of the wiring substrate 2 and the upper surface of the piezoelectric resonator 4 except for a lid 4a of the piezoelectric resonator 4, are covered with a resin member 6. By covering the circuit element and electrical coupling parts with the resin member 6 as described above, for example, a drift in resonant frequency due to the humidity is restrained. Thus, the reliability of the piezoelectric device (piezoelectric oscillator) 1 is increased. The piezoelectric device 1 configured as described above is disclosed, for example, in JP-A-2008-078778.

Certainly, the piezoelectric device 1 configured as described above can contribute to downsizing of the mount area and ensuring of high airtightness. However, in recent years, the piezoelectric resonator 4 has been required to increase accuracy thereof. For this reason, the piezoelectric resonator 4 has been often required to use a glass lid as the lid 4a so that the frequency can be adjusted after the package is sealed.

However, if a glass lid is used, the glass lid is fixed to a ceramic package base using a brittle material such as a low-melting-point-glass as a bonding material. Unlike metal, glass has no ductility and has high brittleness. Also, when the piezoelectric device is chucked by using a chucking jig 7 in order to mount the piezoelectric device on a mount substrate, the jig may make contact with a corner of the resin portion covering the piezoelectric resonator, depending on the chucking angle. When the chucking jig makes contact with a corner of the resin portion and thus stress is applied to the corner, the stress may be intensively applied to the joint made of the low-melting-point-glass having high brittleness. This may cause a problem such as cracking or peeling off of the joint.

SUMMARY

An advantage of the invention is to provide an electronic device that, even if a package using a glass lid is mounted, is allowed to prevent cracking or peeling off of a bonding material serving as the joint of the lid and a package base due to chucking of a resin portion. Another advantage of the invention to provide a method for manufacturing an electronic device having the above-mentioned advantage.

An electronic device according to a first aspect of the invention includes: a package including a lid and a package base, the package being formed by bonding the lid to a joint surface of the package base using a bonding material; and a resin portion covering the package. The resin portion covers at least the package base and the bonding material. At least a part of the resin portion has a section outline. The section outline has an outermost portion thereof in a direction parallel with a mount surface of the electronic device. The outermost portion is located below a lower surface of the lid in a direction perpendicular to the mount surface of the electronic device.

In the electronic device configured as described above, stress applied to the resin portion does not intensively act on the lid or bonding material even if a brittle material is used as a bonding material for bonding together the package base and lid. Therefore, cracking or peeling off of the lid due to chucking of the resin portion is restrained.

In the electronic device according to the first aspect of the invention, the outermost portion is preferably located below the joint surface of the package base in the direction perpendicular to the mount surface of the electronic device.

By adopting the above-mentioned configuration, action of stress applied to the resin portion upon the bonding material is more effectively restrained. Therefore, cracking or peeling off of the lid is prevented.

In the electronic device according to the first aspect of the invention, the section outline preferably has a sagging portion linking an upper end of the outermost portion and a surface of the lid, and the sagging portion is preferably formed in the form of a fillet.

By adopting the above-mentioned configuration, action of stress applied to the resin portion upon the bonding material is more reliably restrained. Also, there is obtained an advantage that even if stress is applied to the sagging portion, the stress is dispersed.

In the electronic device according to the first aspect of the invention, the section outline preferably has a sagging portion linking an upper end of the outermost portion and a surface of the lid, and the sagging portion is preferably formed in the form of a chamfer.

The sagging portion having the above-mentioned configuration can be formed by means of mechanical processing. Therefore, no difference is made in the shape or depth of the sagging portion among electronic devices, and cracking or peeling off of the lid and cracking of the bonding material are restrained.

In the electronic device according to the first aspect of the invention, the package is preferably a piezoelectric resonator containing a piezoelectric resonator element. A circuit substrate including a circuit element is preferably coupled to a mount electrode provided on a lower surface of the package via a conductive coupling member. The resin portion preferably covers the circuit element and the coupling member.

By adopting the above-mentioned configuration, the coupling member, circuit element, and the like are protected. Also, the resin portion plays various roles of ensuring the mechanical joint strength between the circuit substrate and package, preventing cracking or peeling off of the lid, and the like.

A method for manufacturing electronic devices according to a second aspect of the invention is a method for manufacturing electronic devices having a resin portion formed around a package. The method includes: (a) disposing a plurality of packages in a frame and pouring a resin into the frame so as to cover the packages with the resin; (b) scraping off the resin attached to upper surfaces of lids of the packages and a part of the resin poured between the lids of the adjacent packages using a squeegee; and (c) obtain individual electronic devices corresponding to the packages after the resin hardens.

By manufacturing electronic devices by performing such steps, the above-mentioned electronic devices are manufactured without increasing the number of steps compared with that in the related-art manufacturing process.

In the method for manufacturing electronic devices according to the second aspect of the invention, step (b) is preferably performed in only one of a direction of long edges of the package and a direction of short edges thereof.

By adopting such a method, the above-mentioned electronic devices are manufactured if the resin is scraped off in only one of the long edge direction and short edge direction.

A method for manufacturing electronic devices according to a third aspect of the invention is a method for manufacturing electronic devices having a resin portion formed around a package. The method includes: (a) disposing a plurality of packages in a frame and pouring a resin into the frame so as to cover the packages with the resin; (b) scraping off the resin attached to upper surfaces of lids of the packages using a squeegee; (c) half-cutting the resin along cutting lines for obtaining the individual electronic devices using a first blade after the resin hardens; and (d) cutting the resin along the cutting lines using a second blade having a width smaller than a width of the first blade so as to obtain the individual electronic devices, after step (c).

By manufacturing electronic devices by performing such steps, the sagging portion is formed by means of mechanical processing. Therefore, electronic devices are manufactured without causing unevenness in shape of the sagging portions and no difference is made among the electronic devices with respect to the resistance to cracking or peeling off of the lid.

In the method for manufacturing electronic devices according to the third aspect of the invention, step (c) is preferably performed in only one of a direction of long edges of the package and a direction of short edges thereof.

By performing the half-cutting along only one edge direction, the time for step (c) is reduced.

BRIEF DESCRIPTION OF THE DRAWINGS

The invention will be described with reference to the accompanying drawings, wherein like reference numerals represent like elements.

DESCRIPTION OF EXEMPLARY EMBODIMENTS

Now, electronic devices and manufacturing methods thereof according to exemplary embodiments of the invention will be described in detail with reference to the accompanying drawings. Each embodiment will be described using a piezoelectric device including a piezoelectric resonator, specifically, a piezoelectric oscillator as an example of an electronic device.

Figure 1A:
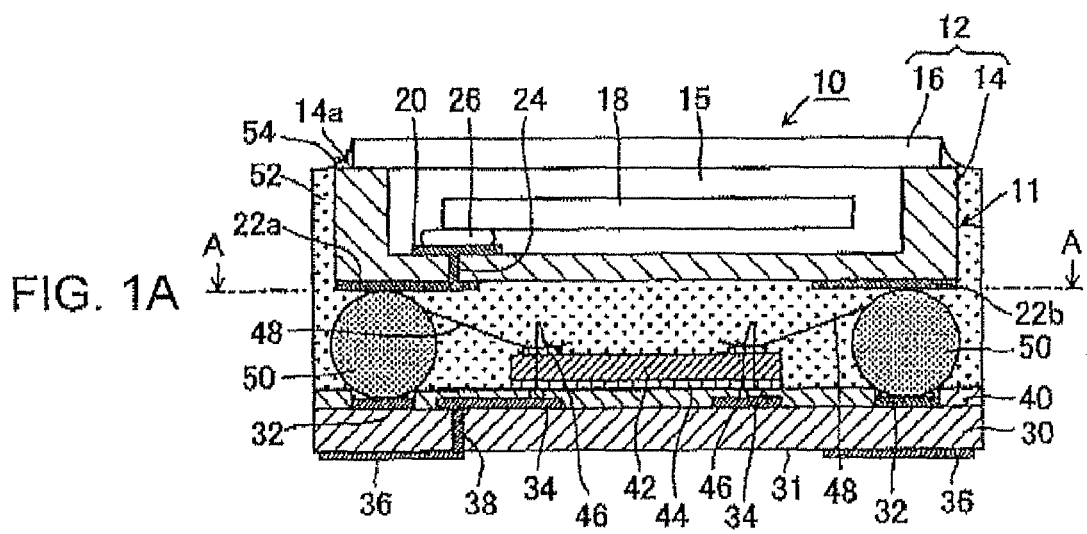
FIGS. 1A to 1C are drawings showing a configuration of an electronic device according to a first embodiment of the invention.
Figure 1B:
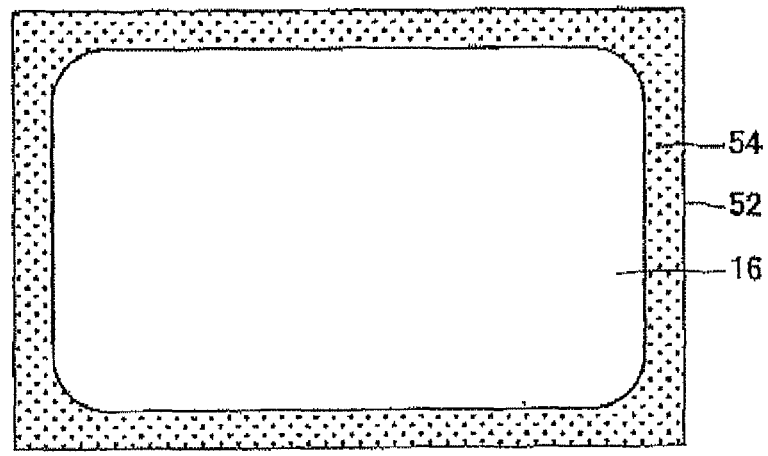
Figure 1C:
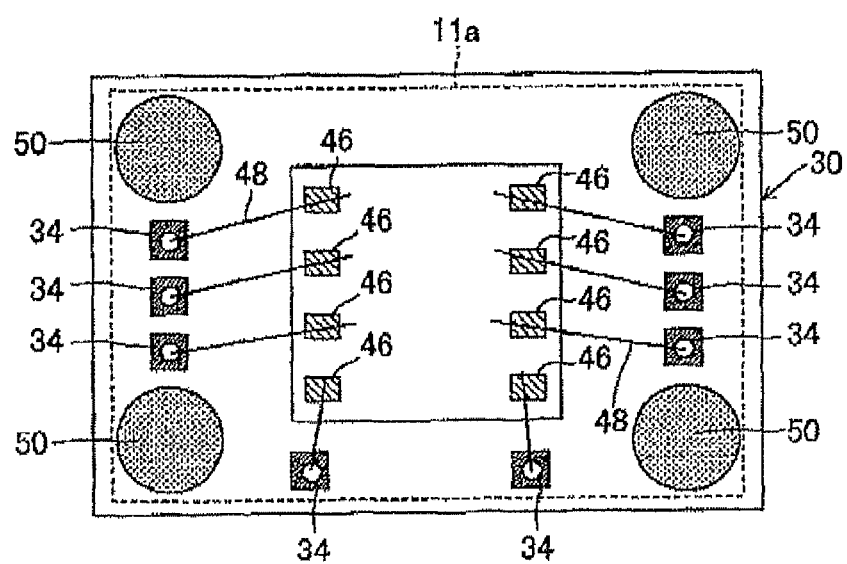

First, an electronic device according to a first embodiment of the invention will be described with reference to FIGS. 1A to 1C. Of FIGS. 1A to 1C, FIG. 1A is schematic drawing showing a side sectional view of a piezoelectric oscillator, FIG. 1B is a plan view, and FIG. 1C is a drawing showing a section as seen along arrows A-A of FIG. 1A.

A piezoelectric oscillator 10 basically includes a piezoelectric resonator 11, an integrated circuit (IC) 42 serving as a circuit element, and a wiring substrate 30 for mounting the IC 42. The piezoelectric resonator 11, IC 42, and wiring substrate 30 are disposed in such a manner that these elements are stacked in the thickness direction.

The piezoelectric resonator 11 basically includes a piezoelectric resonator element 18 and a package 12 containing the piezoelectric resonator element 18. As a material made of the piezoelectric resonator element 18, various piezoelectric materials such as quartz crystal, lithium tantalate, and lithium niobate can be used. However, in terms of temperature characteristics and the like, it is said that a material of quartz crystal is excellent. Among specific examples of the piezoelectric resonator element 18 using a quartz crystal material are an AT-cut piezoelectric resonator element, a BT-cut piezoelectric resonator element, a tuning fork-type piezoelectric resonator element, and a SAW element. The package 12 basically includes a package base 14 for mounting the above-mentioned piezoelectric resonator element 18 and a lid 16, which is a lid for sealing an upper opening of the package base 14.

The package base 14 is formed by laminating multiple substrates formed by shaping a ceramic green sheet made of an insulating material such as aluminum oxide and then sintering the laminated substrates. For the package base 14 configured as described above, at least two substrates, that is, a substrate forming a bottom plate and a substrate forming a side wall are required to manufacture a package base taking a form shown in FIG. 1A. The package base 14 according to this embodiment is provided with a terminal (mount pad) 20 for mounting the piezoelectric resonator element 18 on a first surface of the substrate forming a bottom plate and a mount external terminals 22 (22a, 22b) on the other surface thereof, that is, on the bottom surface of the package base 14. Of the mount external terminals 22, the mount external terminal 22a is electrically coupled to the mount pad 20 through a via hole 24.

The lid 16 is formed using, as a base material, a translucent member having a thermal expansion ratio close to that of the above-mentioned package base 14, such as soda glass. The lid 16 is bonded to a joint surface 14a of the package base 14 using a bonding material 17 (not shown; see FIG. 2) such as low-melting-point glass.

The piezoelectric resonator element 18 is mounted on the package base 14 configured as described above, using a conductive adhesive 26. The mount step is outlined as follows. That is, the conductive adhesive 26 is applied onto the mount pad 20 of the package base 14, and the piezoelectric resonator element 18 is mounted on the mount pad 20 so that an input/output electrode (not shown) of the piezoelectric resonator element 18 is located on an upper part of the applied conductive adhesive 26. Subsequently, the upper opening of the package base 14 is sealed using the lid 16. It is desirable that a cavity 15 of the package 12 be evacuated.

A metal pattern for electrically coupling the piezoelectric resonator 11 and IC 42 and electrically coupling the IC 42 and mount external terminals 36 is drawn on one surface of the wiring substrate 30. Also, the mount external terminal 36 for mounting the piezoelectric oscillator 10 on a substrate (not shown) or the like of an electronic apparatus is provided on a mount surface 31, which is a second surface (bottom surface) of the wiring substrate 30. Also, on the second surface of the wiring substrate 30, an adjustment terminal (not shown) for inspecting characteristics of the IC or rewriting information inside the IC (adjusting characteristics) may be provided as necessary.

On the first surface of the wiring substrate 30, a coating 40 made of an insulative coating material such as a resist is formed. Except for the coating 40, only bonding pads 34 electrically coupled to the IC 42 via a metal wire and coupling pads 32 for disposing coupling members 50 to be described in detail later are in contact with the first surface of the wiring substrate 30. The bonding pads 34 and mount external terminals 36 are electrically coupled to each other through via holes 38 (a part thereof is shown). The IC 42 may be configured to have not only an oscillation circuit function but also a frequency-temperature characteristic compensation function or the like. A circuit element according to the invention is not limited to an IC and may be a circuit element formed by electronic components such as a resistance and a capacitor.

The IC 42 according to this embodiment is mounted near the center of the first surface of the wiring substrate 30 with an active surface thereof directed upward. When mounting the IC 42, it is desirable to use an adhesive member 44 such as a non-conductive adhesive or an adhesive sheet. The IC 42 is mounted on the wiring substrate 30 by means of so-called "wire bonding" using a metal wire 48, specifically, a gold wire or the like. Wire bonding performed when manufacturing the piezoelectric oscillator 10 according to this embodiment is preferably a so-called "reverse bonding" construction method including a first bonding step where bonding is performed on the bonding pad 34 disposed on the wiring substrate 30 and a second bonding step where bonding is performed on pads 46 disposed on the active surface of the IC 42 after the first bonding step. By performing bonding in this order, bonding can be performed even if the linear distance between the bonding pad 34 on the wiring substrate 30 and the pad 46 on the IC 42 is short. Also, by using such a bonding method, the loop height of the metal wire 48 formed above the pad 46 on the IC 42 can be restrained. For the piezoelectric oscillator 10 according to this embodiment, the bonding pads 34 disposed on the wiring substrate 30 are disposed between the coupling pads 32. This allows ensuring the distance between the pad 46 on the IC 42 and the bonding pad 34, as well as allows effective use of space on the surface of the wiring substrate 30.

The piezoelectric resonator 11 is mounted on the wiring substrate 30 above the IC 42 with the coupling members 50 disposed on the coupling pads 32 interposed therebetween. The coupling members 50 electrically and mechanically couple the couplings pad 32 disposed on the wiring substrate 30 and the mount external terminals 22 disposed outside the package 12 of the piezoelectric resonator 11. Note that the coupling between the mount external terminal 22b, which is a terminal other than the terminal coupled to the piezoelectric resonator element 18, and the coupling pad 32 is performed to ensure the mechanical stability, coupling strength, and the like of the piezoelectric resonator 11.

While the coupling members 50 may be made of generally known solder balls or the like, the coupling members 50 according to this embodiment is preferably configured as follows. That is, the coupling members 50 are made of two or more types of members having different melting points where a member having a high melting point and serving as a core is coated with a conductive member having a low melting point. Specifically, the coupling members 50 are members where copper or a resin having a high melting point is used as the core of a sphere and the core is coated with solder. By using the coupling members configured as described above, the support height of the object to be supported (piezoelectric resonator 11 in this embodiment) is determined on the basis of the core while performing electrical coupling using the solder with which the core is coated. Also, if the core is made of a conductive material such as copper, electrical coupling is also performed by the core.

Also, the piezoelectric oscillator 10 according to this embodiment includes the above-mentioned elements as well as a resin portion 52, which serves as a protection member and is made of an insulating resin. The resin portion 52 is made of a resin member (mold material) formed from the surface of the wiring substrate 30 on which the IC 42 is mounted, to the upper end face of the lid 16 in the piezoelectric resonator 11. The resin portion 52 covers the IC 42 mounted on the first surface of the wiring substrate 30, the coupling members 50, and the package base 14 and bonding material 17 of the piezoelectric resonator 11. By adopting the covering form of the resin portion 52 as described above, it is possible to expose the upper surface of the lid 16 having translucency while increasing portions covered by the resin portion 52.

By exposing the upper surface of the lid 16, it is possible to pass a laser through the lid 16 from the outside, apply the laser to the piezoelectric resonator element 18 and thus adjust the oscillation frequency, after forming the piezoelectric oscillator 10, that is, after combining the piezoelectric resonator 11 and IC 42 (wiring substrate 30). This makes it possible to reduce a deviation from a desired oscillation frequency. Also, if marking is made on the surface of the lid 16 by means of printing or the like, it is possible to check the marking visually.

That is, it is possible to obtain various advantages, such as one that resistance to moisture is strengthened, one that the oscillation frequency can be adjusted after combining the IC 42 and piezoelectric resonator 11, and one that the marking can be visually checked. Also, even if the piezoelectric oscillator 10 is heated and the coupling members 50 are molten in a reflow step performed when the piezoelectric oscillator 10 is mounted on a mount substrate of an electronic apparatus, the molten coupling members 50 are prevented from flowing out of the piezoelectric oscillator 10, since the coupling members 50 are covered with the resin portion 52. Also, in the piezoelectric oscillator 10 according to this embodiment, the resin portion 52 is formed to the same height as that of the upper surface of the lid 16. That is, since the piezoelectric oscillator 10 is resin-sealed except for the upper surface of the lid 16 and the bottom surface and side surfaces of the wiring substrate 30, it is possible to reduce the height of the piezoelectric oscillator 10 while obtaining a protection effect produced by the resin portion 52.

Figure 2:
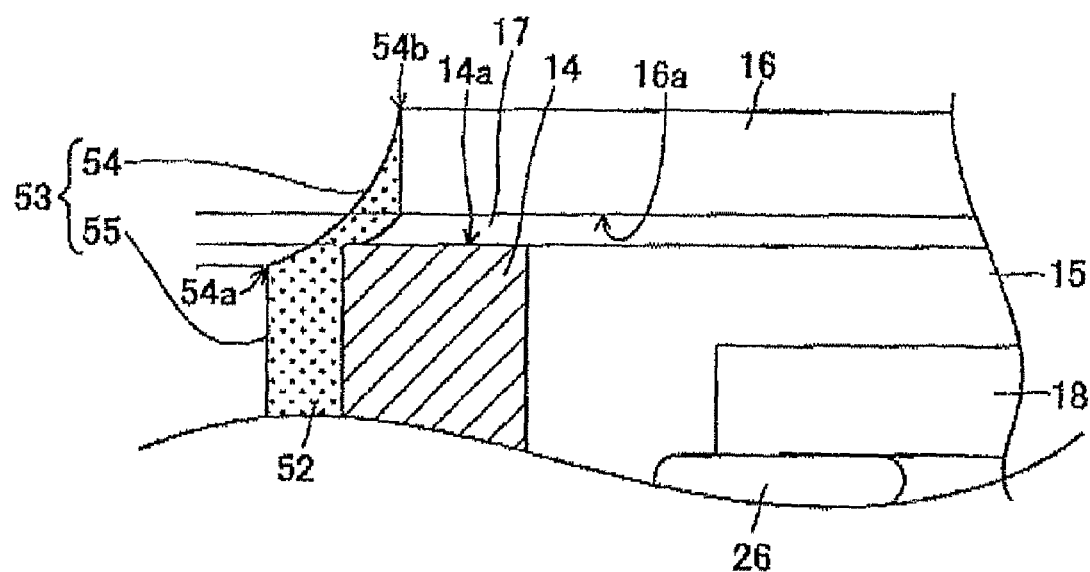
FIG. 2 is a partial enlarged drawing of the electronic device.

FIG. 2 is a partial enlarged view of the piezoelectric oscillator 10 according to this embodiment and is a sectional view with respect to a surface perpendicular to the mount surface 31 of the piezoelectric oscillator 10. At least part of the resin portion 52 surrounding the package base 14 has a section outline 53 as shown in FIG. 2. The section outline 53 has an outermost portion 55, which is the outermost portion of the section outline 53 in a direction parallel with the mount surface 31 of the piezoelectric oscillator 10 and a sagging portion 54, which links an upper end 54a of the outermost portion 55 and the surface of the lid 16. The outermost portion 55 is located below the lower surface of the lid 16 in a direction perpendicular to the mount surface 31 of the piezoelectric oscillator 10. Specifically, in the piezoelectric oscillator 10, the sagging portion 54 is formed from the periphery of the lid 16, which is the upper end of the resin portion 52, to a side surface of the resin portion 52 in the form of a fillet in such a manner that the height of the resin portion 52 is reduced. More specifically, a lower end 54a (see FIG. 2) of the fillet (sagging portion 54) using an upper periphery of the lid 16 as an upper end 54b thereof, that is, the horizontal position of a side end of the side surface is located below the horizontal position of a lower surface 16a of the lid 16.

By adopting the above-mentioned configuration, even if the bonding material 17 made of a brittle material such as low-melting-point-glass is used as the joint of the package base 14 and lid 16, stress is not intensively applied to the bonding material 17 when bringing a chucking jig into contact with the resin portion 52 in order to mount the piezoelectric oscillator 10 on the mount substrate. For this reason, even if the chucking jig makes contact with the resin portion 52 obliquely, cracking or peeling off of the joint of the package base 14 and lid 16 or the lid 16 is prevented.

Also, since the outermost portion 55 is located below the joint surface 14a of the package base 14 in a direction perpendicular to the mount surface 31 of the piezoelectric oscillator 10, intensive application of stress to the bonding material 17 is more reliably restrained.

A broken line 11a shown in FIG. 1C shows an external shape of the piezoelectric resonator 11. As seen, the piezoelectric resonator 11 is disposed inside the external shape of the wiring substrate 30 with a predetermined gap provided therebetween. The resin member is disposed in the gap and all the four side surfaces of the piezoelectric resonator 11 are covered with the resin member. Thus, the piezoelectric resonator 11 is fixed more firmly.

Also, for the piezoelectric oscillator 10 configured as described above, by checking the action of the piezoelectric resonator 11 or adjusting the frequency thereof before mounting the piezoelectric resonator 11 on the wiring substrate 30, a failure can be found in advance. This allows avoidance of waste, such as that where a failure is found after mounting the piezoelectric resonator 11 and thus the entire piezoelectric oscillator 10 is discarded together with the IC 42. This results in restraint on the manufacturing cost.

Figure 3:
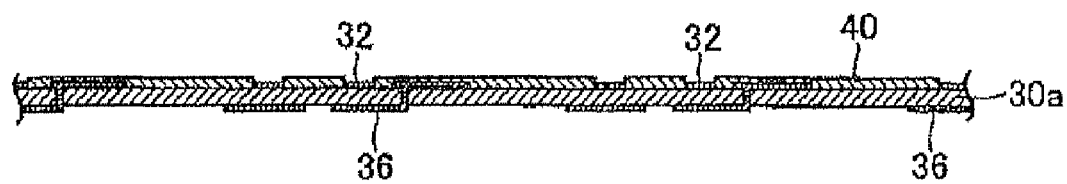
FIG. 3 is a first drawing showing a process of manufacturing the electronic device according to the first embodiment.
Figure 4:
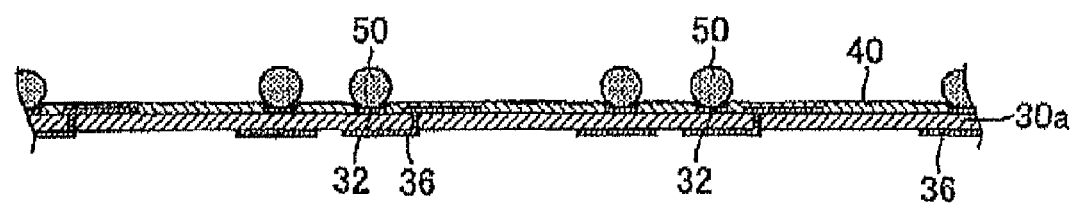
FIG. 4 is a drawing showing a step of disposing coupling members on a disposed sheet-shaped substrate.
Figure 5:
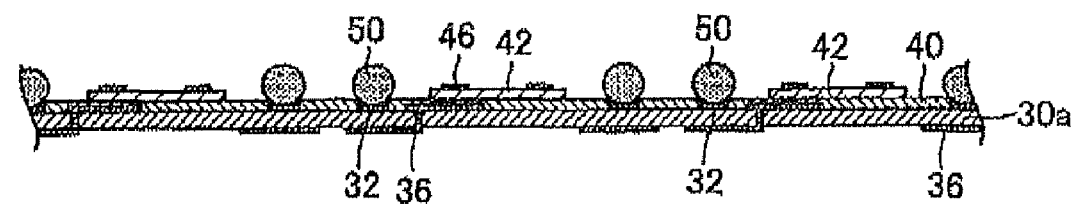
FIG. 5 is a drawing showing a step of mounting ICs on the sheet-shaped substrate.
Figure 6:
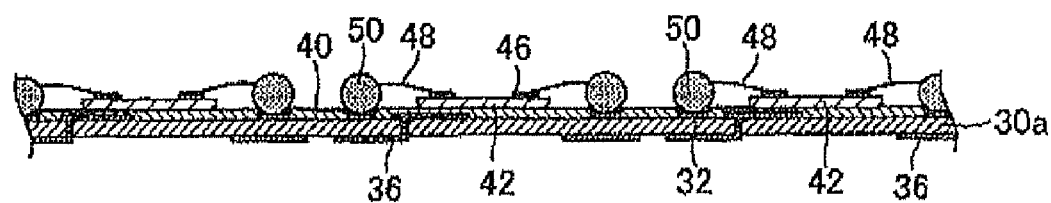
FIG. 6 is a drawing showing a step of bonding the mounted ICs using wires.
Figure 7:
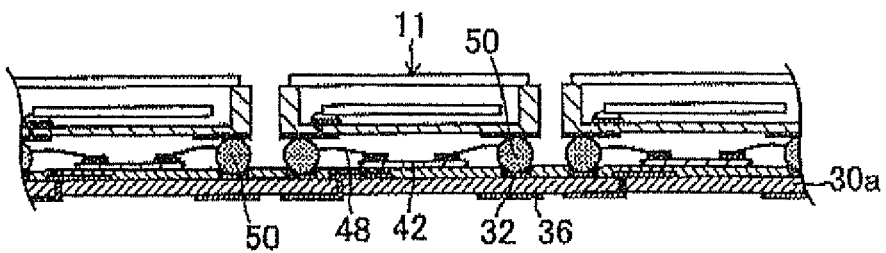
FIG. 7 is a drawing showing a step of mounting piezoelectric resonators with the coupling members between the sheet-shape substrate and the resonators.

Next, a method for manufacturing a piezoelectric oscillator configured as described above will be described. First, a sheet-shaped wiring substrate (sheet-shaped substrate) 30a is disposed in a frame for shaping a resin (not shown) with one surface of the sheet-shaped substrate 30a directed upward. Here, the sheet-shaped substrate 30a refers to a substrate that have yet to be made into individual wiring substrates 30 of piezoelectric oscillators 10 having the above-mentioned configuration (see FIG. 3). Next, the coupling members 50 are disposed on the coupling pads 32 disposed on the wiring substrate 30a (see FIG. 4). Subsequently, the ICs 42 are disposed on predetermined positions of the sheet-shaped substrate 30a (see FIG. 5). Subsequently, the pad 46s disposed on the active surfaces of the ICs 42 and the bonding pads 34 (not shown) disposed on the sheet-shaped substrate 30a are coupled using metal wires 48 (see FIG. 6). Subsequently, the previously manufactured piezoelectric resonators 11 are mounted on the sheet-shaped substrate 30a with the coupling members 50 therebetween (see FIG. 7).

Figure 8:
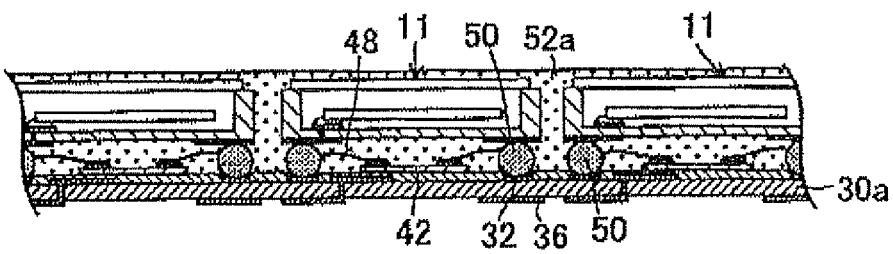
FIG. 8 is a drawing showing a step of covering entire piezoelectric oscillators with a resin member.
Figure 9:
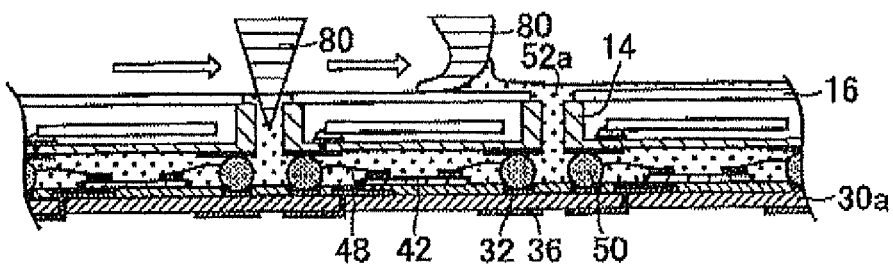
FIG. 9 is a drawing showing an aspect of scraping off of a resin portion using a squeegee.

Subsequently, a fluid resin member 52a is poured into the frame (not shown) having the sheet-shaped substrate 30a disposed thereon so that the entire piezoelectric oscillators including the piezoelectric resonators 11 are covered with the mold material 52a (see FIG. 8). Before the poured resin member 52a is hardened into the resin portion 52, the surface of the lid 16 of each piezoelectric resonator 11 is scraped using a spatula (squeegee) 80 or the like so that the resin member 52a covering the surface of the lid 16 is scraped off. At that time, the scraping is performed while pressing the squeegee 80 in such a manner that the tip of the squeegee is located below the joint surface 14a (see FIG. 2) of the side wall (frame) of the package base 14 included in each piezoelectric resonator 11 (see FIG. 9). Thus, a larger amount of the resin member located between the piezoelectric resonators 11 is scraped off. Thus, the resin member poured between the adjacent piezoelectric resonators 11 takes a shape where, due to surface tension, the side surfaces of the lids 16 having wettability become the highest parts (upper ends 54b) and the central parts between the adjacent piezoelectric resonators 11 are recessed. As seen, by performing the step of scraping off the resin member 52a attached to the exposed portions before the poured resin member 52a hardens, it is possible to easily remove the mold material 52a attached to the surfaces of the lids 16 without damaging the lids 16. Also, as for the gaps made between the piezoelectric resonators 11, the gaps extending in the vertical direction and the gap extending in the lateral direction are connected to each other. Therefore, by only scraping off a larger amount of the resin member from one (for example, vertical direction) of the vertical direction (long edge direction) and the lateral direction (short edge direction), the resin member is poured from the gaps extending in the other direction (for example, lateral direction). This makes it possible to form fillets from the upper surfaces of the lids in both the vertical grooves and the lateral grooves (see FIG. 10).

Figure 10:
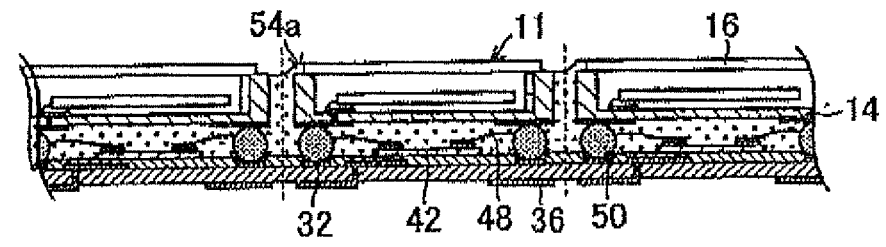
FIG. 10 is a drawing showing a state where convex grooves are made between piezoelectric resonators.
Figure 11:
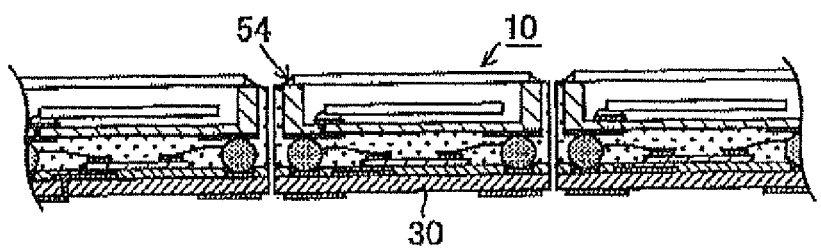
FIG. 11 is a drawing showing a step of obtaining individual electronic devices.

After the mold material 52a hardens, dicing is performed at portions shown by broken lines in FIG. 10 to obtain individual piezoelectric oscillators. Thus, the piezoelectric oscillators 10 are completed (see FIG. 10).

By manufacturing the piezoelectric oscillators 10 through the above-mentioned steps, it is possible to adjust the frequency of each piezoelectric resonator 11 using the resin member while increasing resin-sealed parts to improve resistance to moisture or the like. It is also possible to manufacture piezoelectric oscillators that, if marking is made on the lid 16 of the piezoelectric resonator 11, allow visual check of the marking. Also, the sagging portion 54 leading to the upper end of the resin portion 52 is configured by changing only the depth to which the squeegee 80 is pressed. Therefore, it is possible to manufacture the piezoelectric oscillator 10 according to this embodiment with the same number of steps as that in the related-art piezoelectric oscillator manufacturing method.

Also, for the manufactured piezoelectric oscillator 10, even if the bonding material 17 made of a brittle material such as low-melting-point-glass is used as the joint of the package base 14 and lid 16, stress is not intensively applied to the bonding material 17 when chucking the resin portion 52, nor is the joint cracked or peeled off.

Figure 12:
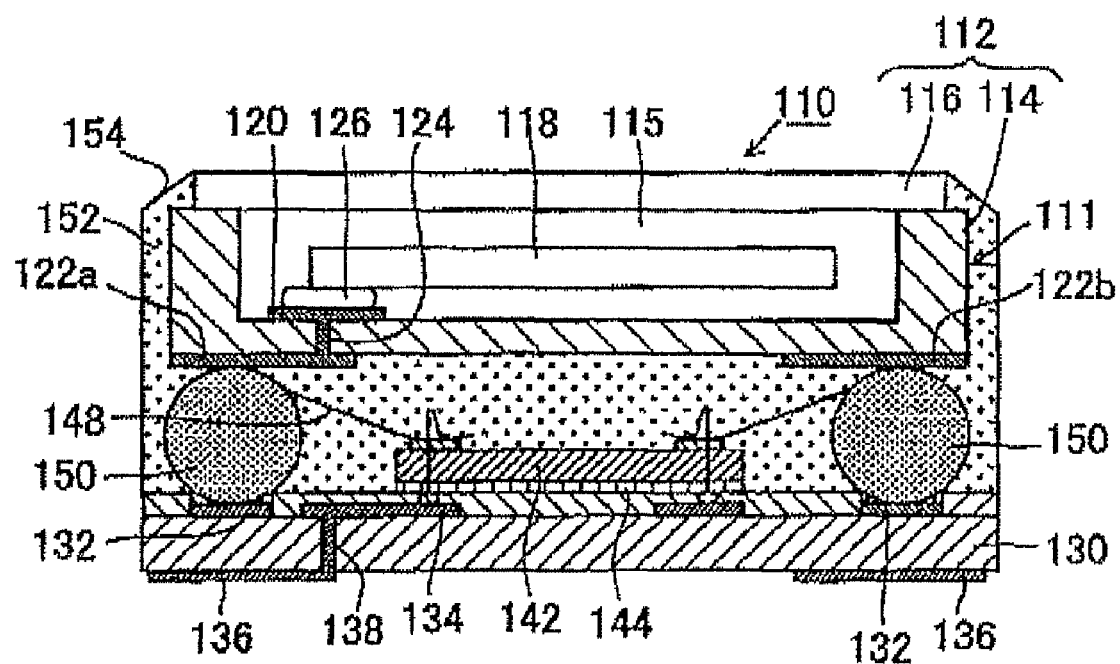
FIG. 12 is a drawing showing a configuration of an electronic device according to a second embodiment of the invention.

Next, an electronic device according to a second embodiment of the invention will be described with reference to FIG. 12. The electronic device according to this embodiment has approximately the same configuration as that of the piezoelectric oscillator 10 according to the first embodiment shown in FIGS. 1 and 2. Therefore, same elements are given reference numerals where 100 is added to those in FIGS. 1 and 2 and will not be described in detail.

A piezoelectric oscillator 110 according to this embodiment is different from the piezoelectric oscillator 10 according to the first embodiment with respect to the configuration of the sagging portion of the resin portion. That is, in the piezoelectric oscillator 10 according to the first embodiment, a fillet is formed from the periphery of the upper surface of the lid 16 to the side surface of the resin portion 52. On the other hand, in the piezoelectric oscillator 110 according to this embodiment, a slope in the form of a chamfer is formed from the periphery of the upper surface of a lid to a side surface of a resin portion 152. This slope is referred to as a sagging portion 154.

Even if the above-mentioned configuration is adopted, as with the piezoelectric oscillator 10 according to the first embodiment, it is possible to avoid intensive application of stress to a bonding material 117 (not shown) and thus prevent cracking or peeling off of the joint of a package base 114 and a lid 116. Also, since the sagging portion 154 is configured as described above, it is possible to form the sagging portion 154 by means of mechanical processing. Therefore, there is no case where a difference is made due to the difference in such as ease with which the resin member is poured. With respect to the other configurations, action, and advantages, this embodiment is the same as the piezoelectric oscillator 10 according to the first embodiment.

A method for manufacturing a piezoelectric oscillator having the above-mentioned configuration is as follows.

Figure 13:
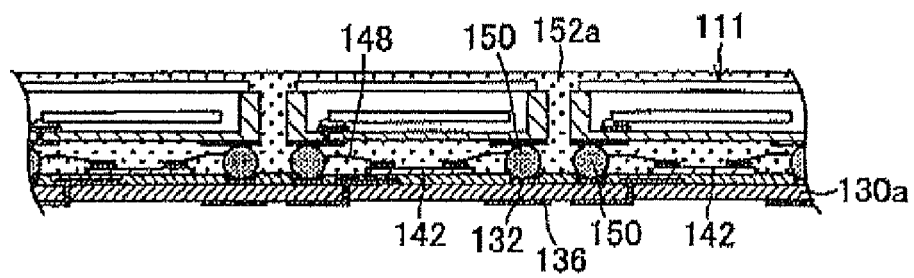
FIG. 13 is a drawing showing commonalities between a method for manufacturing the electronic device according to the second embodiment and that according to the first embodiment.

The initial steps of mounting piezoelectric resonators 111 on a sheet-shaped substrate 130a and pouring a resin member 152a into a frame (not shown) so as to cover the entire piezoelectric oscillators with the resin member are the same as those of the piezoelectric oscillator manufacturing method according to the first embodiment (see FIG. 13).

Figure 14:
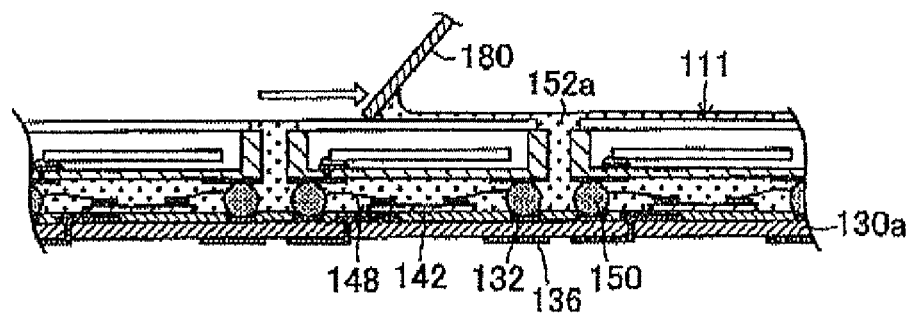
FIG. 14 is a drawing showing an aspect of scraping off of a resin portion using a squeegee.

Next, the resin member 152a attached to lid 116s of the piezoelectric resonators 111 is eliminated using a squeegee 180. At that time, in the piezoelectric oscillator 10 according to the first embodiment, the squeegee 80 is pressed in such a manner that the tip of the squeegee 80 is located below the frame of the package base 14 and thus parts of the resin member 52a filled between the piezoelectric resonators 11 are scraped off. On the other hand, in this embodiment, it is sufficient to scrape off only the resin member attached to the upper surfaces of the lids 16. Therefore, it is sufficient to keep the tip of the squeegee 180 at a height at which the tip can make contact with the surfaces of the lids 116 (see FIG. 14).

Figure 15:
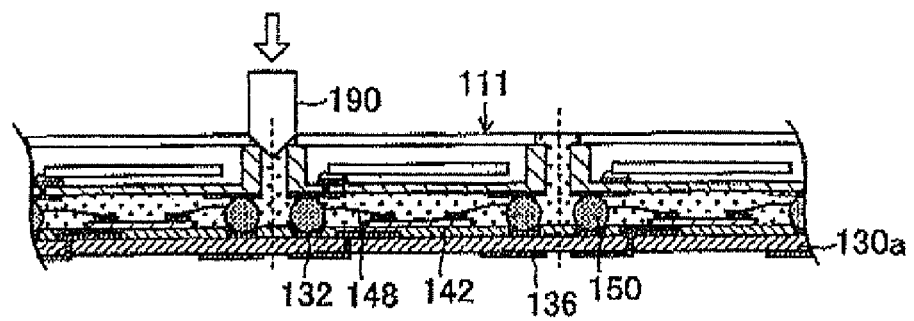
FIG. 15 is a drawing showing an aspect of a half-cutting step.

After the resin member 152a hardens, half-cutting for obtaining piezoelectric oscillators is performed using a blade (first blade) 190 having a thickness (width) similar to the interval between the adjacent piezoelectric resonators 111. The first blade 190 has slopes at an edge thereof. Thus, V-shaped grooves are formed on half-cut surfaces (see FIG. 15).

Figure 16:
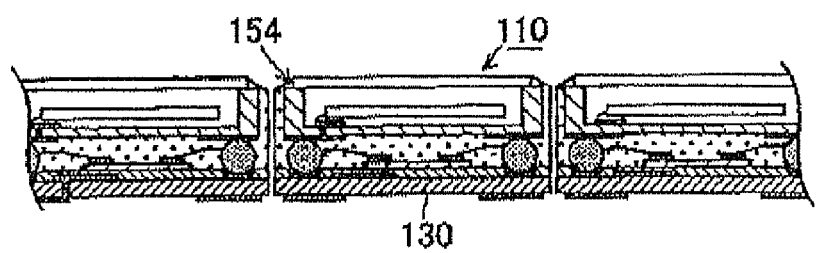
FIG. 16 is a drawing showing a step of obtaining individual electronic devices.

After the half-cutting, full-cutting for obtaining individual piezoelectric resonators 110 is performed at the central portions of the V-shaped grooves using a second blade (not shown) having a thickness smaller than that of the first blade 190 (see FIG. 16).

As seen, by performing cutting in two stages using the blades having different thicknesses and shapes, it is possible to manufacture the piezoelectric resonators 110 having a slope at the upper end of the resin portion 152.

Figure 17:
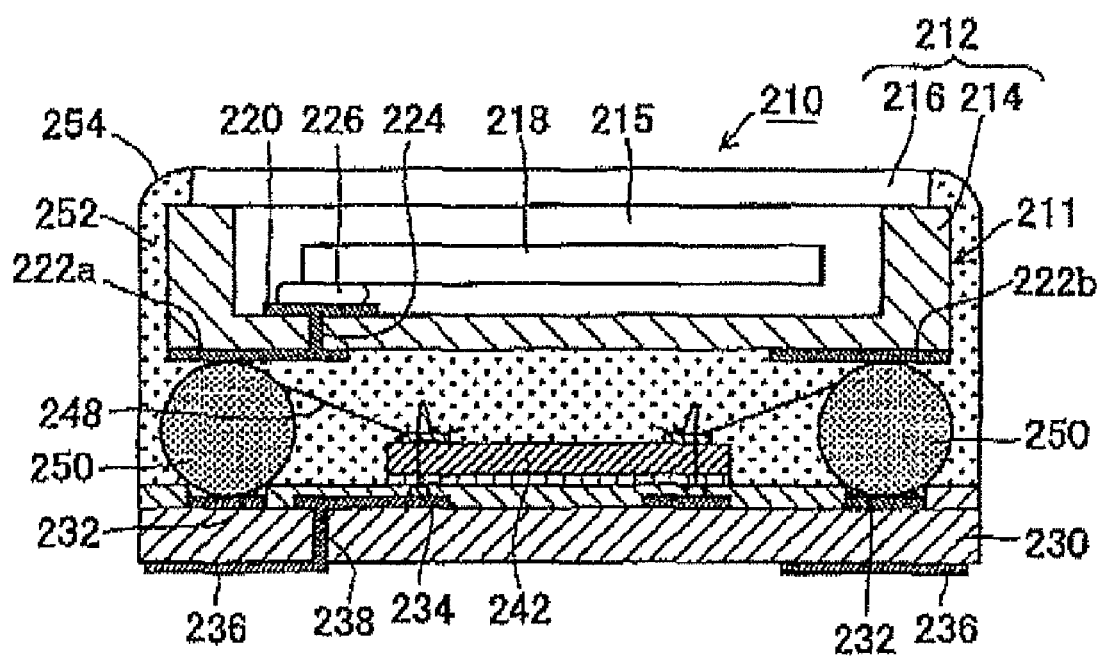
FIG. 17 is a drawing showing an applied form of a sagging portion.

Also, a resin portion of an electronic device according to the invention may have an upper end configured as shown in FIG. 17. The piezoelectric oscillator shown in FIG. 17 has approximately the same configuration as those of the piezoelectric oscillators according to the first and second embodiments. Therefore, in FIG. 17, same elements are given reference numerals where 200 is added to those shown in FIG. 1 and will not be described in detail. The difference is that a convex R is formed at a corner and the R is referred to as a sagging portion 254. If the sagging portion 254 is configured as described above, it is desirable to locate the central point of the curvature forming R below the lower surface of a lid 216, preferably, below the horizontal position of the upper end of the side wall of a package base 214.

Even if the above-mentioned is adopted, advantages similar to those of the electronic devices according to the first and second embodiments are obtained.

Figure 18A:
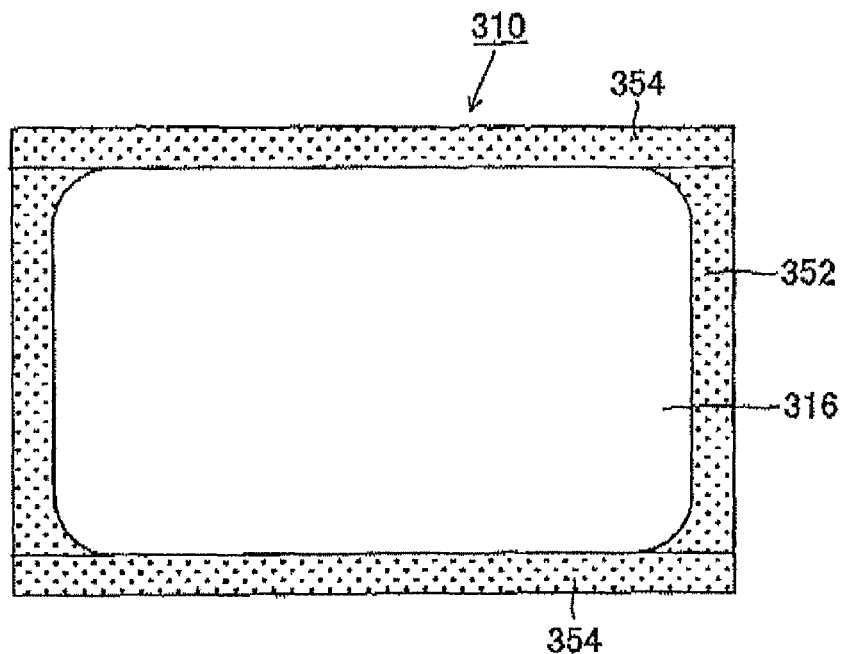
FIGS. 18A and 18B are drawings showing two views of an electronic device according to the invention.
Figure 18B:
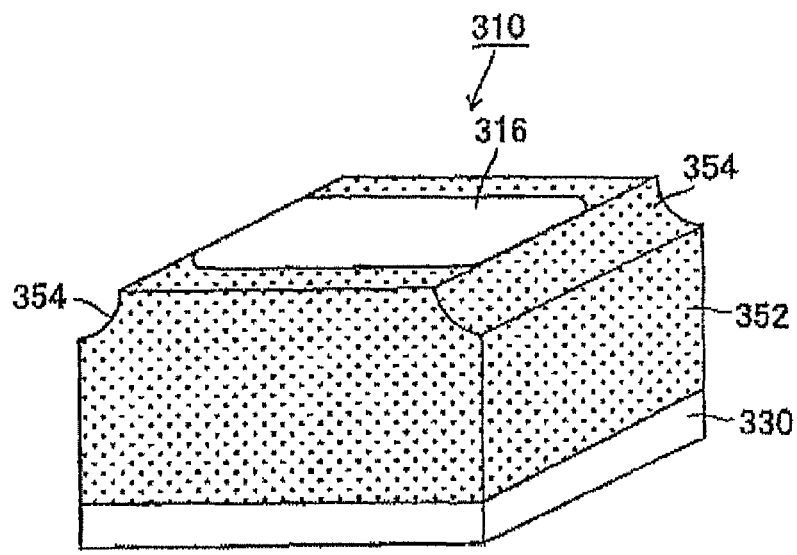
Figure 19:
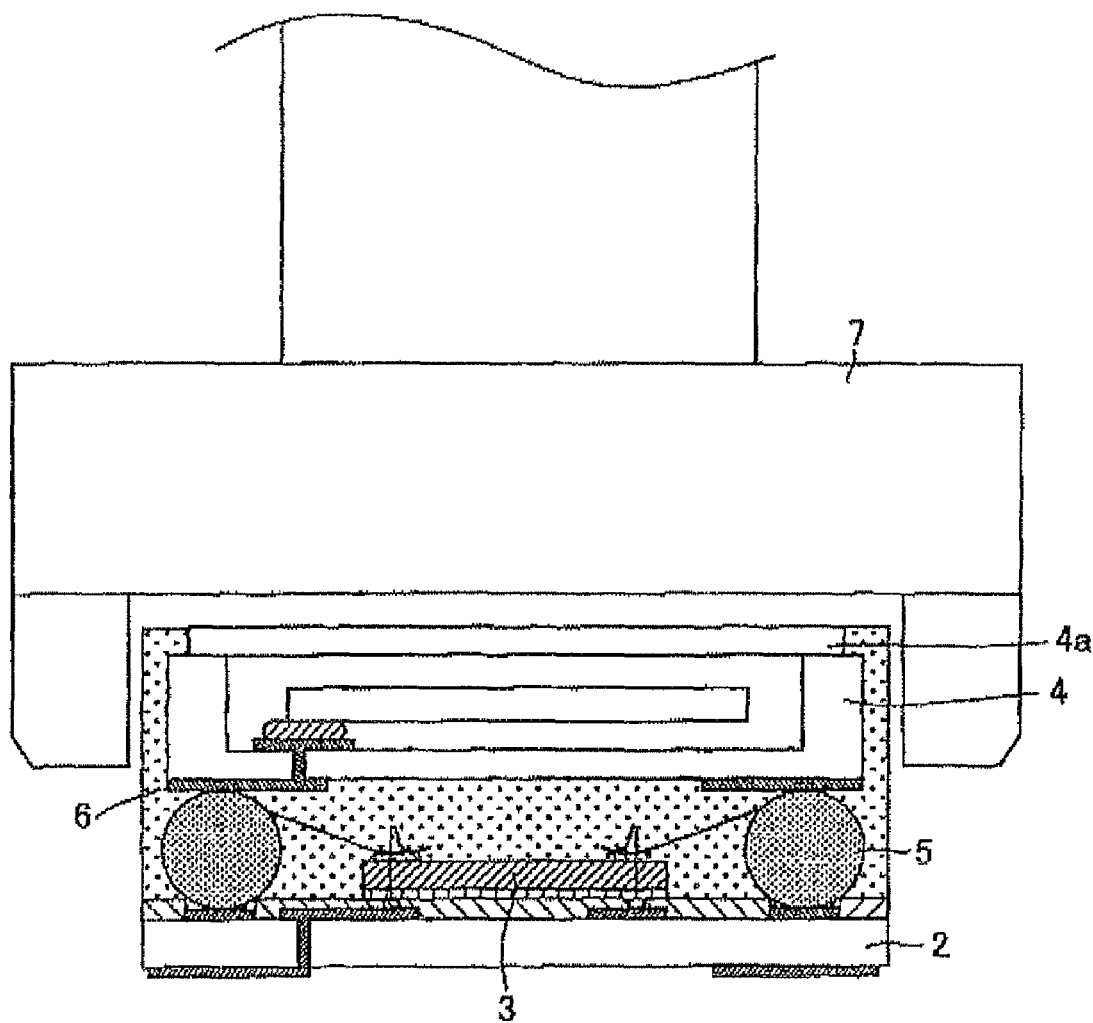
FIG. 19 is a drawing showing a configuration of a related-art electronic device.

Also, a sagging portion formed on a resin portion of an electronic device according to the invention does not always need to be provided in such a manner that it surrounds a lid. It is sufficient to provide a sagging portion on at least a portion to which stress is to be applied. Therefore, for example, it is sufficient to provide a sagging portion on a portion with which a chucking jig makes contact. That is, as shown in FIGS. 18A and 18B, it is possible to provide sagging portions 354 in a resin portion located outside opposed two edges of an external shape of a lid 316. A piezoelectric oscillator 310 configured as described also has advantages similar to those of the electronic devices according to the first and second embodiments. While the sagging portions 354 of the piezoelectric oscillator 310 shown in FIGS. 18A and 18B are shown in the form of fillets, the sagging portions 354 may be formed by half-cutting. In this case, the sagging portions 354 each take the shape of a chamfer. However, the action thereof does not make a difference. Also, by forming the sagging portions 354 at only a pair of edges in the long edge direction (or short edge direction), the time required for the half cutting step is reduced.

The entire disclosure of Japanese Patent Application No. 2008-254104, filed Sep. 30, 2008 is expressly incorporated by reference herein.

What is claimed is:

1. An electronic device comprising:
  a package including a lid and a package base, the package being formed by bonding the lid to a joint surface of the package base using a bonding material; and
  a resin portion covering the package, wherein:
  the resin portion covers at least the package base and the bonding material; at least a part of the resin portion has a section outline; the section outline has an outermost portion thereof in a direction parallel with a mount surface of the electronic device; and the outermost portion is located below a lower surface of the lid in a direction perpendicular to the mount surface of the electronic device.

2. The electronic device according to claim 1, wherein the outermost portion is located below the joint surface of the package base in the direction perpendicular to the mount surface of the electronic device.

3. The electronic device according to claim 1, wherein the section outline has a sagging portion linking an upper end of the outermost portion and a surface of the lid, and the sagging portion is formed in the form of a fillet.

4. The electronic device according to claim 1, wherein the section outline has a sagging portion linking an upper end of the outermost portion and a surface of the lid, and the sagging portion is formed in the form of a chamfer.

5. The electronic device according to claim 1, wherein: the package is a piezoelectric resonator containing a piezoelectric resonator element; a circuit substrate including a circuit element is coupled to a mount electrode provided on a lower surface of the package via a conductive coupling member; and the resin portion covers the circuit element and the coupling member.

\* \* \* \* \*